(12) United States Patent
Liu

(10) Patent No.: US 6,319,795 B1
(45) Date of Patent: Nov. 20, 2001

(54) METHOD FOR FABRICATING VLSI DEVICES HAVING TRENCH ISOLATION REGIONS

(75) Inventor: Jacson Liu, Hsinchu (TW)

(73) Assignee: Mosel Vitelic Inc. (CN)

( * ) Notice: Subject to any disclaimer, the term of this patent is extended or adjusted under 35 U.S.C. 154(b) by 0 days.

(21) Appl. No.: 09/478,125

(22) Filed: Jan. 5, 2000

(30) Foreign Application Priority Data

Jan. 5, 1999 (TW) ............................................... 088100083

(51) Int. Cl.$^7$ .................................................... H01L 21/76
(52) U.S. Cl. .......................... 438/424; 438/297; 438/425; 438/439
(58) Field of Search .................................. 438/296, 297, 438/424, 439, 425; 257/510

(56) References Cited

U.S. PATENT DOCUMENTS

| | | | |
|---|---|---|---|
| 4,873,203 | * 10/1989 | Kaga et al. ............................. | 438/424 |
| 4,965,221 | * 10/1990 | Dennison et al. ....................... | 438/297 |
| 5,004,703 | * 4/1991 | Zdebel et al. .......................... | 438/439 |
| 5,096,848 | * 3/1992 | Kawamura ............................. | 438/439 |
| 5,360,753 | * 11/1994 | Park et al. ............................. | 438/439 |
| 5,436,190 | * 7/1995 | Yang et al. ............................. | 438/425 |
| 5,677,232 | * 10/1997 | Kim et al. ............................. | 438/424 |
| 5,756,389 | * 5/1998 | Lim et al. ............................. | 438/425 |
| 5,795,814 | * 8/1998 | Tasaka ................................... | 438/424 |
| 6,090,685 | * 7/2000 | Gonzales et al. ...................... | 438/424 |

FOREIGN PATENT DOCUMENTS 0 282 629 * 8/1987 (EP) ............................. H01L/27/10

* cited by examiner

Primary Examiner—Charles Bowers
Assistant Examiner—David S Blum
(74) Attorney, Agent, or Firm—Heller Ehrman White & McAuliffe LLP (57) ABSTRACT

A process for fabricating a VLSI device comprising trench isolation regions. The trench isolation regions of a VLSI device is fabricated by a process comprising the following steps: Depositing and patterning pad layers on a substrate to form active regions separated from pad-layer-covered regions; forming side walls at each active region to cover portions of the active region other than its central portion; depositing a first oxide at the space surrounded by the side walls and the central portion of the active region; removing the side walls to form trenches at the active region; and depositing a second oxide on the substrate to fill the trenches and cover the first oxide, the second oxide and the first oxide together forming an oxide trench isolation region.

19 Claims, 6 Drawing Sheets

METHOD FOR FABRICATING VLSI DEVICES HAVING TRENCH ISOLATION REGIONS

BACKGROUND OF THE INVENTION

1. Field of the Invention

This invention relates generally to processes for fabricating very-large-scale integrated (VLSI) circuits, and in particular to a new process for forming line-width-independent self-aligned trench isolations that separate VLSI circuit elements.

2. Description of the Prior Art

Semiconductor devices are constantly being miniaturized. As both the overall dimensions of semiconductor devices and the lithographic line widths for making such devices are made smaller and smaller hundreds of thousands of integrated circuit (IC) elements such as metal-oxide-semiconductor field-effect transistors (MOSFETs) are formed within each square centimeter of a semiconductor substrate surface. To prevent these elements from short-circuiting or electronically interfering with one another, isolation regions must be formed at the surface of the substrate to define and separate each of the regions where the IC elements are to be formed. Conventional art for forming such isolation regions include, for example, the use of the local oxidation of silicon (LOCOS) process to form field oxide (FOX) regions, and the shallow trench isolation (STI) process, both of which are well-known to those skilled in the art.

Figure 1A:
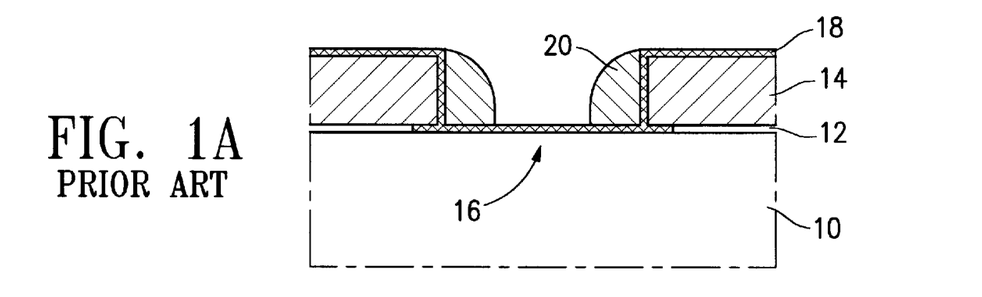
FIG. 1A is a schematic, cross-sectional representation of the substrate of a prior-art semiconductor device after formation of pad oxide, pad nitride, the poly-Si layer and the nitride side walls.

As an example of the current state of the conventional art, FIGS. 1A–1G depict various stages of a process that combines the features of LOCOS and STI to form isolation regions on a semiconductor substrate. As shown in FIG. 1A, a pad oxide (e.g., silicon oxide) layer 12 and a pad nitride (e.g., silicon nitride) layer 14 are sequentially formed on a semiconductor substrate 10. Conventional lithographic and etching techniques are used to remove portions of the pad nitride 14 and the pad oxide 12, exposing a plurality of surface areas of the substrate. Each such surface area defines an active region 16.

Next, a thin polysilicon (poly-Si) layer 18 is deposited on the substrate, covering the pad nitride layers 14 as well as the active regions 16. Silicon nitride side walls 20 are then formed on portions of the active region 16 and next to the side walls of the poly-Si-coated pad nitride layers 14, leaving the central portion of the active region 16 covered only by the poly-Si layer 18.

Figure 1B:
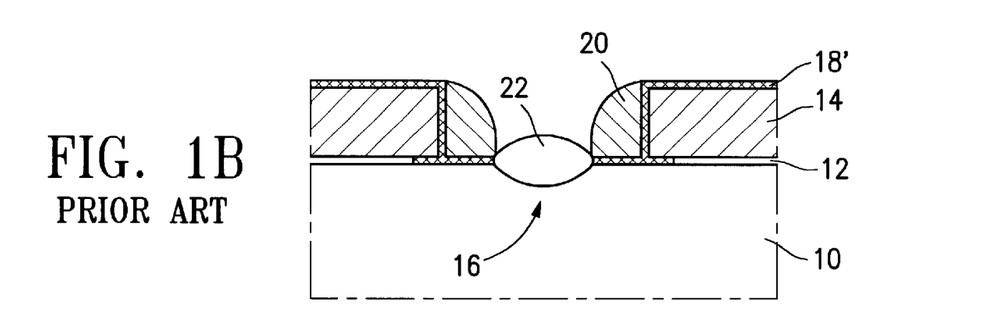
FIG. 1B is a schematic, cross-sectional representation of the substrate of FIG. 1A after formation of the field oxide region.

Next, as shown in FIG. 1B, through a thermal oxidation process, a field oxide region 22, partly inset in the substrate 10, is formed at the central portion of the active region 16. The exposed portions of poly-Si 18' located at the top of the pad nitride are also oxidized as a result of this oxidation process.

Figure 1C:
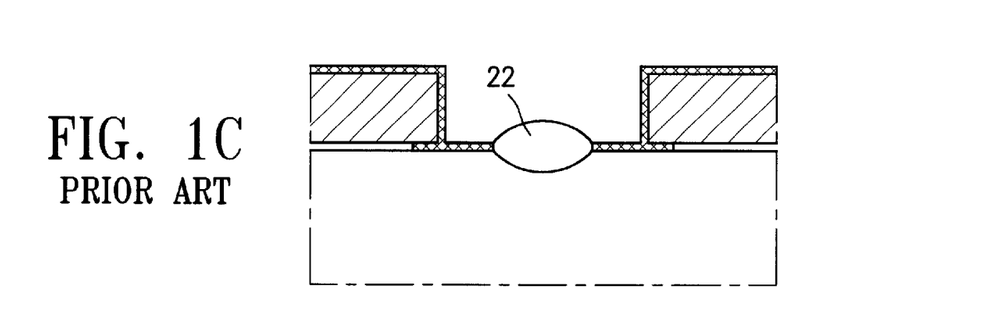
FIG. 1C is a schematic, cross-sectional representation of the substrate of FIG. 1B after removal of the nitride side walls.
Figure 1D:
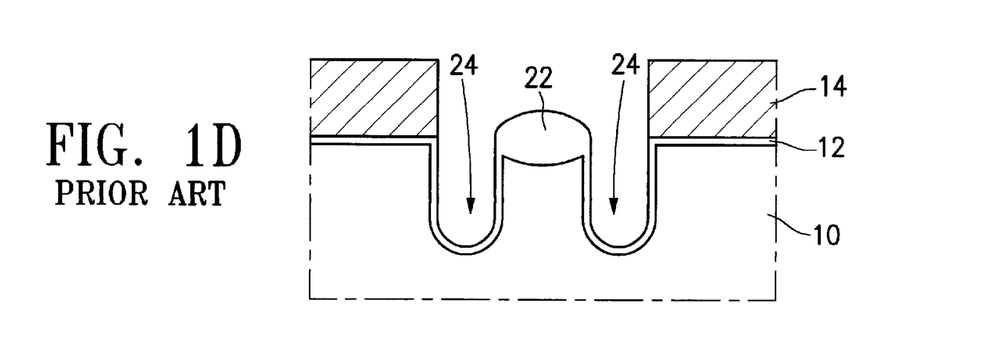
FIG. 1D is a schematic, cross-sectional representation of the substrate of FIG. 1C after formation of trenches in the substrate.
Figure 1E:
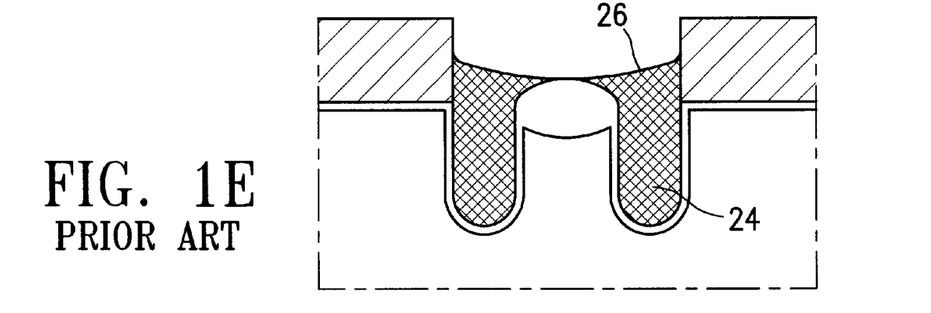
FIG. 1E is a schematic, cross-sectional representation of the substrate of FIG. 1D after filling of the trenches with poly-Si.

Next, the silicon nitride side walls 20 are removed by a phosphoric acid etch; see FIG. 1C. The phosphoric acid etch process is continued until trenches 24 are formed in the substrate 10; see FIG. 1D. Typically, the oxidized side walls of the trenches 24 are further implanted with ions to prevent channeling across the trenches.

Figure 1F:
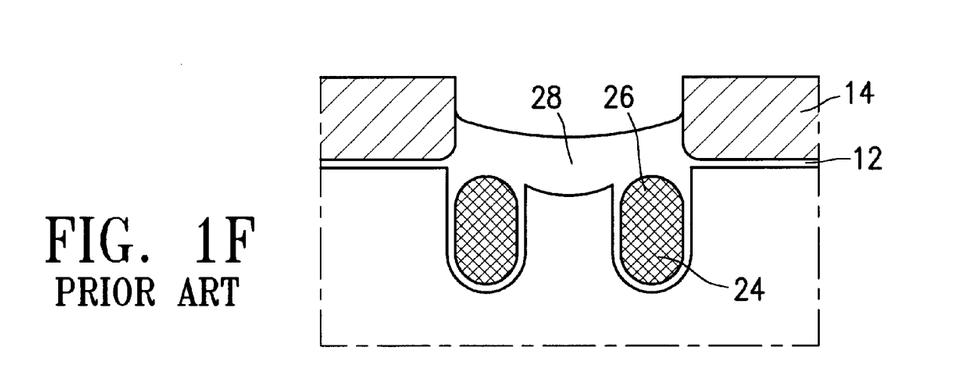
FIG. 1F is a schematic, cross-sectional representation of the substrate of FIG. 1E after partial oxidation of the poly-Si.
Figure 1G:
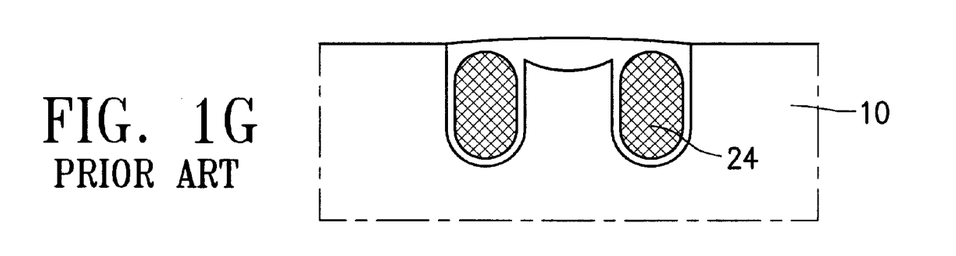
FIG. 1G is a schematic, cross-sectional representation of the substrate of FIG. 1F after formation of trench isolations in the substrate.

Subsequently, another poly-Si layer 26 is deposited to fill up the trenches 24. This second poly-Si layer 26 is back-etched to form the profile shown in FIG. 1E. The top portion of this poly-Si layer 26 is then oxidized to form silicon oxide 28 as shown in FIG. 1F. Finally, after pad nitride 14, pad oxide 12 and the top part of the silicon oxide 28 are removed, the substrate 10 is left with filled trenches 24, which will function as the isolation regions separating the IC elements to be fabricated on the substrate 10.

Although the aforesaid conventional process for forming isolation regions has enabled the fabrication of IC elements that do not interfere or cross-talk with one another, the constant miniaturization of VLSI devices dictates that additional improvements be made to the formation of these isolation regions. For example, the aforesaid field oxide formation process is very time-consuming and tends to reduce the throughput of the overall process. More important, as the lithographic line width is reduced to 0.25 $\mu$m or smaller (i.e., sub-quarter-micron or deep sub-micron), it becomes more and more difficult to control the critical dimensions of the isolation regions through conventional exposure and etching schemes. Device miniaturization also reduces the tolerance for misalignment in lithographic and etching processes involved in conventional trench-formation processes. In short, there is plenty of room for improvement in the fabrication of isolation regions of VLSI semiconductor devices.

SUMMARY OF THE INVENTION

Accordingly, it is an object of the present invention to provide a new isolation formation process for forming isolation regions between the circuit elements of the VLSI device.

In accordance with the object described above, the present invention provides a method of fabricating oxide trench isolation regions of a VLSI device, which method includes the following processing steps:

Depositing and patterning pad layers on a substrate to form active regions separated from pad-covered regions;

forming side walls at each active region to cover portions of the active region other than its central portion;

depositing a first oxide at the space surrounded by the side walls and the central portion of the active region;

removing the side walls and forming trenches at the active region; forming a second oxide on the substrate to fill the trenches and cover the first oxide, the second oxide and the first oxide together forming an oxide trench isolation region; and removing the pad layers.

In accordance with the object described above, the present invention provides another method of fabricating isolation regions of a VLSI device, which method includes the following processing steps:

Depositing and patterning pad layers on a substrate to form active regions separated from pad-covered regions;

forming side walls at each active region to cover portions of the active region other than its central portion;

depositing a first oxide at the space surrounded by the side walls and the central portion of the active region;

removing the side walls and forming trenches at the active region;

depositing polysilicon on the substrate to fill the trenches and cover the first oxide, oxidizing the top portion of the polysilicon to form a second oxide, the second oxide and the first oxide forming an oxide mass, the oxide mass and the bottom portion of the polysilicon together forming a trench isolation region; and removing the pad layers.

Essentially, the trench isolation fabrication processes disclosed herein have the following significant advantages over those taught in the conventional art:

An advantage of the present invention is that, by eliminating a time-consuming thermal oxidation processing step, the throughput of the VLSI fabrication process is increased.

Another advantage of the present invention is that it is more compatible with deep sub-micron semiconductor processes than the conventional art because the definition of the isolation regions is not dependent upon a single high-resolution lithographic step.

These and other objects, features and advantages of the present invention will no doubt become apparent to those skilled in the art after reading the following detailed description of the preferred embodiment which is illustrated in the several figures of the drawing.

DETAILED DESCRIPTION OF THE PREFERRED EMBODIMENTS

While the present invention may be embodied in many forms, details of a preferred embodiment are schematically shown in FIGS. 2A through 3G, with the understanding that the present disclosure is not intended to limit the invention to the embodiment illustrated.

The process for forming trench isolation regions in a VLSI device disclosed herein has three unique features: (a) the time-consuming thermal oxidation step generally required in the conventional art is no longer necessary; (b) the definition of the trench isolation regions of the present invention does not rely on merely one single lithographic step, thus greatly reducing the lithographic line width constraints and making the present invention more compatible with deep sub-micron semiconductor processes; and (c) the trench isolation regions of the present invention are formed in a self-aligned manner, such that trench isolation regions having very fine dimensions can be made without relying solely on lithographic steps.

In accordance with a specific embodiment of the present invention, trench isolation regions are formed at the surface of a semiconductor substrate to define regions for VLSI circuit elements to be fabricated thereon; see FIGS. 2A–2G.

Figure 2A:
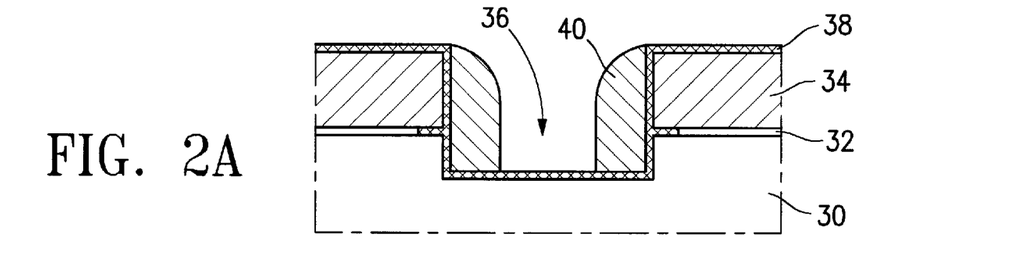
FIG. 2A is a schematic, cross-sectional representation of the substrate of a semiconductor device of the present invention after formation of pad oxide and pad nitride, removal of a portion of the substrate, and formation of the poly-Si layer and the nitride side walls.

As shown in FIG. 2A, a pad oxide layer 32 and a pad nitride layer 34 are sequentially deposited on top of a semiconductor (e.g., silicon) substrate 30. Typically, the pad oxide layer 32 is silicon oxide and is approximately 10 to 50 nm thick, and the pad nitride layer 34 is silicon nitride and is approximately 100 to 300 nm. The as-deposited deposited pad oxide and pad nitride are then patterned by conventional lithographic and etching techniques. Notably, this etching process removes not only those portions of the pad nitride and the pad oxide which are not masked by photoresist (not shown) but also the surface regions of the substrate that are located directly underneath the removed portions of the pad oxide. Each of the substrate regions thus formed defines an active region 36, wherein a trench isolation region will be fabricated as part of the VLSI device. Preferably, approximately 20–100 nm deep of the substrate 30 is removed from an active region 36.

Referring again to FIG. 2A, a thin polysilicon (poly-Si) layer 38 is then deposited on the substrate, covering the pad nitride 34 as well as the active regions 36. As shown in FIG. 2A the pad oxide layer 32 may be previously etched slightly beyond the edges of the pad nitride 32, creating undercuts that are now filled with poly-Si 38. Typically, this poly-Si layer is formed by a chemical vapor deposition (CVD)

process and is approximately 10–50 nm thick. Subsequently, side walls 40 are formed along the side of the poly-Si-coated pad nitride 34, covering portions of the active region 36 shown in FIG. 2A. However, the central portion of the active region 36 is covered only by the poly-Si layer 38. Preferably., side walls 40 are either silicon nitride or silicon oxynitride formed by a plasma-enhanced chemical vapor deposition (PECVD) process.

Figure 2B:
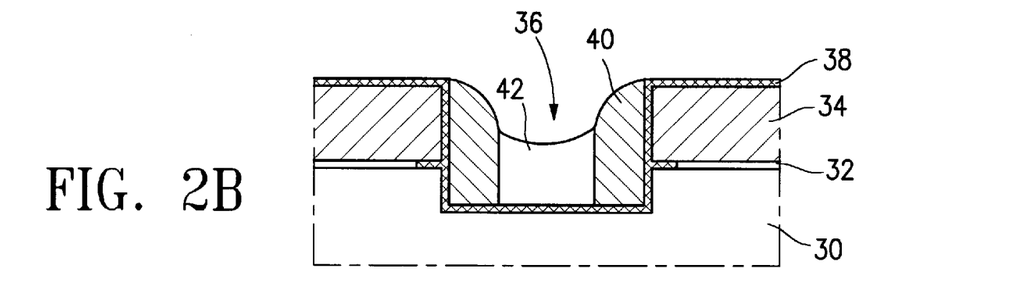
FIG. 2B is a schematic, cross-sectional representation of the substrate of FIG. 2A after deposition of the first oxide.

Next, as shown in FIG. 2B, a first oxide layer 42 is deposited in the space surrounded by the side walls 40 and the poly-Si-covered central portion of the active region 36. Preferably, this first oxide layer is a CVD silicon oxide.

Figure 2C:
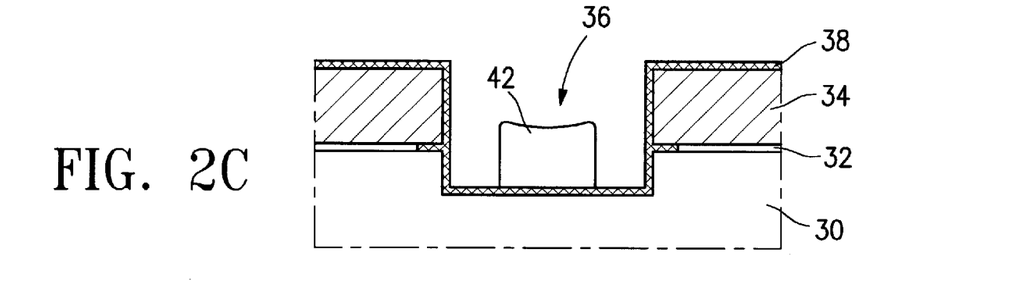
FIG. 2C is a schematic, cross-sectional representation of the substrate of FIG. 2B after removal of the side walls.
Figure 2D:
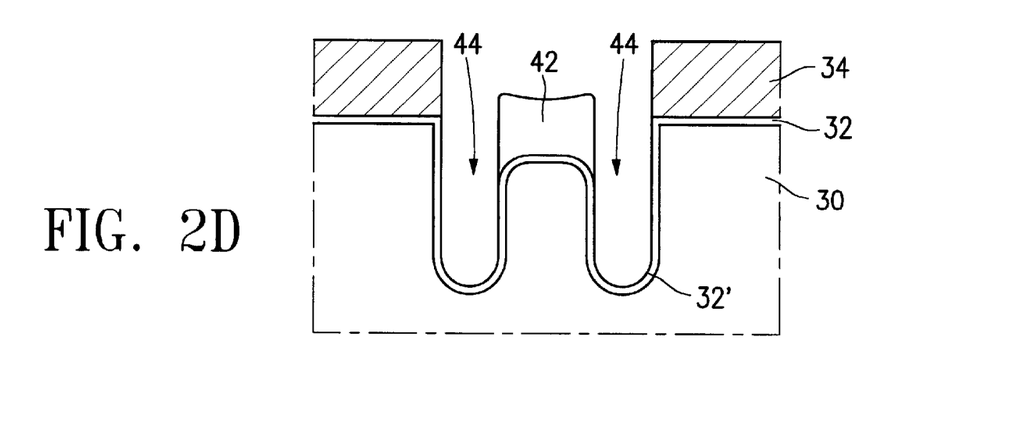
FIG. 2D is a schematic, cross-sectional representation of the substrate of FIG. 2C after formation of trenches in the substrate.

Next, as shown in FIG. 2C, the side walls 40 are removed by a phosphoric acid etch. This etching process is continued until trenches 44 are formed in the substrate 30; see FIG. 2D. As a result of etching, the thin poly-Si layer 38 on top of the pad nitride 34 is also removed, while an oxide layer 32' is formed at the sides and bottoms of the trenches 44. Note that the as-deposited first oxide 42 may also be slightly etched, as evidenced by its rounded corners shown in FIGS. 2C and 2D. However, the etch rates for nitride (or oxynitride) and silicon in the phosphoric acid are much greater than the etch rate for oxide, and as a result deep trenches 44 are formed in the substrate 30. Preferably, the trenches 44 thus formed are approximately 200 to 500 nm deep as measured from the original surface of the substrate 30. Typically, the oxidized side and bottom surfaces of the trenches 44 are doped with suitable ions (boron or phosphor ions) to prevent channeling across the trenches.

Figure 2E:
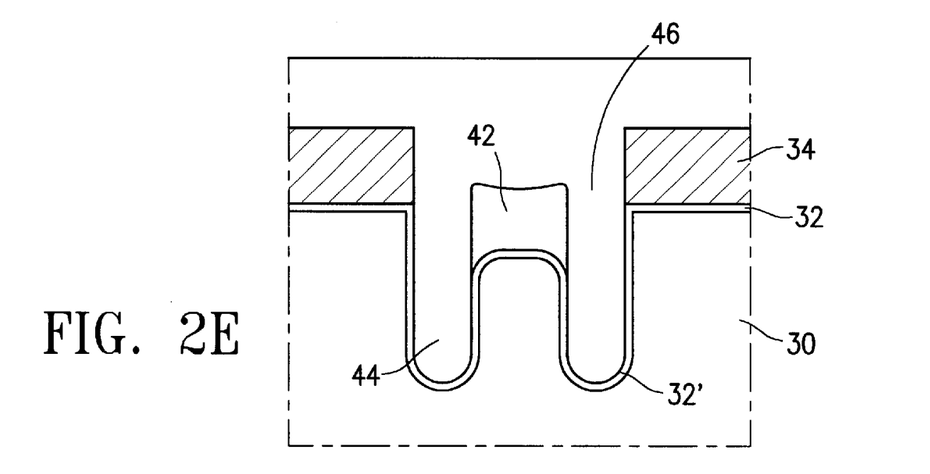
FIG. 2E is a schematic, cross-sectional representation of the substrate of FIG. 2D after deposition of the second oxide.
Figure 2F:
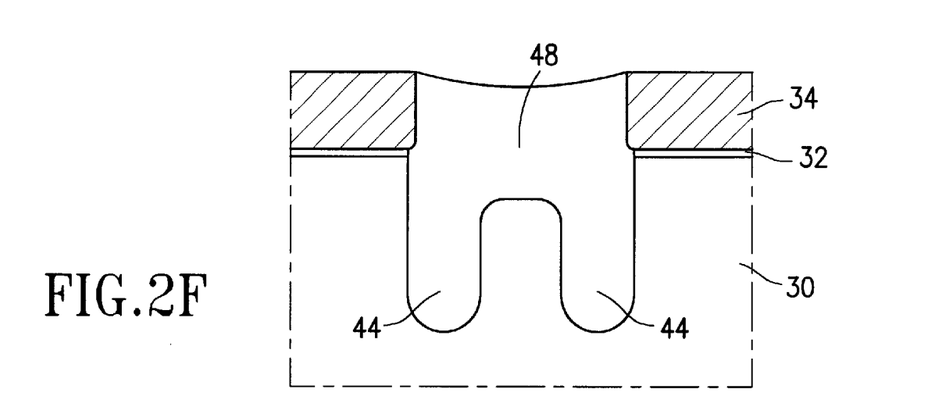
FIG. 2F is a schematic, cross-sectional representation of the substrate of FIG. 2E after removal of the top portion of the oxide mass.
Figure 2G:
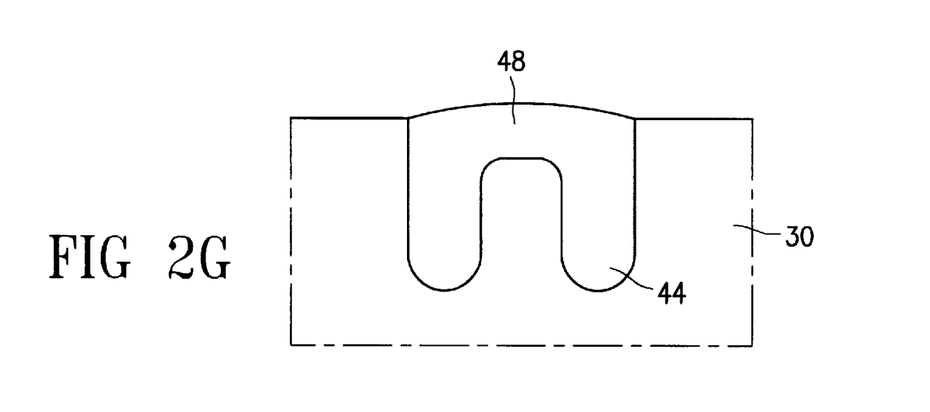
FIG. 2G is a schematic, cross-sectional representation of the substrate of FIG. 2F after formation of the trench isolation regions.

Referring to FIG. 2E, a second oxide 46 is deposited on the entire substrate 30, filling the trenches and covering the first oxide 42 and the pad nitride 34. In effect, this second oxide 46 and the first oxide 42 form a continuous mass of oxide 48 (shown in FIG. 2F). Preferably, this second oxide layer is formed by a CVD or high-density plasma chemical vapor deposition (HDPCVD) process. A back-etch process is then conducted to remove the portions of the second oxide 46 located on top of the pad nitride 34 and to form a typically slightly concave surface for the oxide mass 48 that fills the trenches 44; see FIG. 2F.

Finally, a chemical-mechanical polishing (CMP) process is conducted to remove the pad nitride 34, pad oxide 32 and the top portion of the oxide mass 48. The substrate 30 is left with trenches 44, which will function as the trench isolation regions separating IC elements to be fabricated on the substrate 30. See FIG. 2G. These trenches 44 are filled with oxide mass 48. Typically, the top surface of the remaining oxide mass 48 is slightly convex because the CMP process removes the pad nitride 34 at a slightly higher rate than the oxide 48.

Figure 3A:
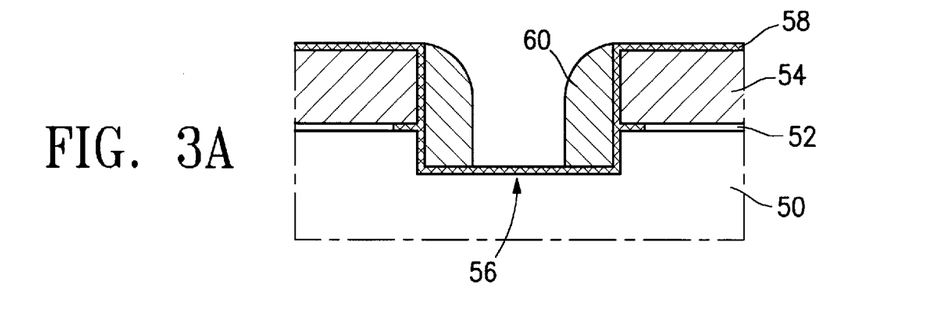
FIG. 3A is a schematic, cross-sectional representation of the substrate of a semiconductor device of the present invention after formation of pad oxide and pad nitride, removal of a portion of the substrate, and formation of the poly-Si layer and the nitride side walls.

In accordance with another specific embodiment of the present invention, trench isolation regions are formed at the surface of a semiconductor substrate to define active regions for VLSI circuit elements to be fabricated thereon; see FIGS. 3A–3G. As shown in FIG. 3A, a pad oxide layer 52 and a pad nitride layer 54 are sequentially deposited on top of a semiconductor (e.g., silicon) substrate 50. Typically, the pad oxide layer 52 is silicon oxide and has a thickness of approximately 10 to 50 nm; the pad nitride layer 54 is silicon nitride and has a thickness of approximately 100 to 300 nm. The as deposited pad oxide and pad nitride are then patterned by conventional lithographic and etching techniques. Again, in the present invention, this etching process removes not only those portions of nitride and oxide which are not masked by photoresist (not shown) but also the surface regions of the substrate that are located directly underneath the removed portions of the pad oxide. Each of the substrate regions thus formed defines an active region 56, wherein a trench isolation region will be fabricated as part of the VLSI device. Preferably, approximately 20 to 100 nm deep of the substrate 50 is removed from an active region 56.

Referring again to FIG. 3A, a thin polysilicon (poly-Si) layer 58 is then deposited on the substrate, covering the pad nitride 54 as well as the active regions 56. Typically, this poly-Si layer is formed by a chemical vapor deposition (CVD) process and is approximately 10–50 nm thick. Subsequently, side walls 60 are formed along the side of the poly-Si-coated pad nitride 54, covering portions of the active region 56 shown in FIG. 3A. however, the central portion of the active region 56 is covered only by the poly-Si layer 58. Preferably, side walls 60 are either silicon nitride or silicon oxynitride formed by a plasma-enhanced chemical vapor deposition (PECVD) process.

Figure 3B:
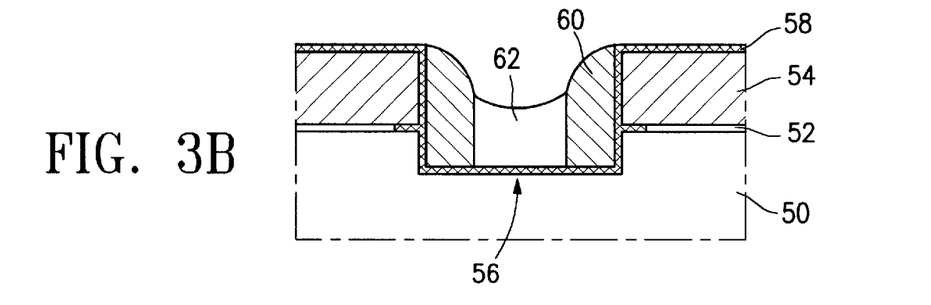
FIG. 3B is a schematic, cross-sectional representation of the substrate of FIG. 3A after deposition of the first oxide.

Next, as shown in FIG. 3B, a first oxide layer 62 is deposited in the space surrounded by the side walls 60 and the poly-Si-covered central portion of the active region 56. Preferably, this first oxide layer is a CVD silicon oxide.

Figure 3C:
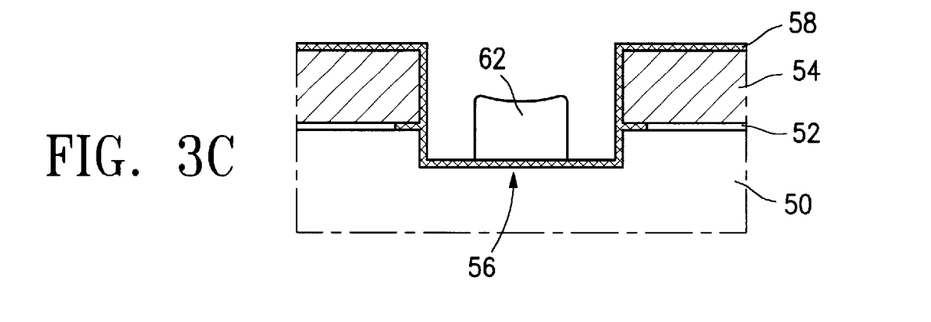
FIG. 3C is a schematic, cross-sectional representation of the substrate of FIG. 3B after removal of the side walls.
Figure 3D:
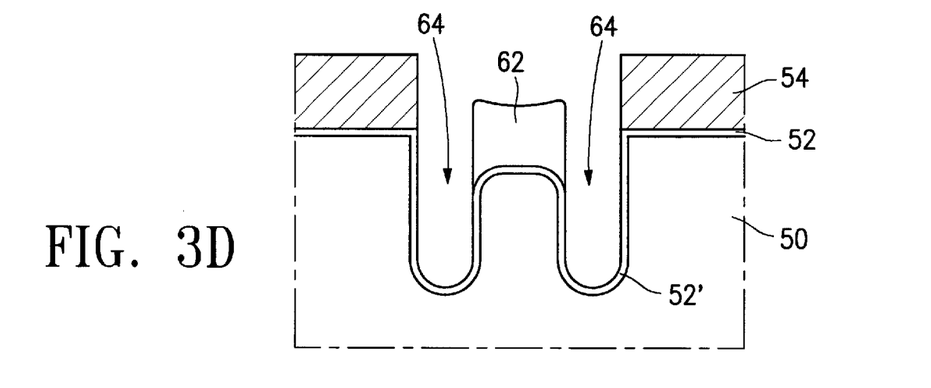
FIG. 3D is a schematic, cross-sectional representation of the substrate of FIG. 3C after formation of trenches in the substrate.

Next, as shown in FIG. 3C, the side walls 60 are removed by a phosphoric acid etch. This etching process is continued until trenches 64 are formed in the substrate 50; see FIG. 2D. As a result of etching, the thin poly-Si layer 58 on top of the pad nitride 54 is also removed, while an oxide layer 52' is formed at the sides and bottoms of the trenches 64. Note that the as-deposited first oxide 62 may also be slightly etched, as evidenced by its rounded corners shown in FIGS. 3C and 3D. However, the etch rates of the nitride (or oxynitride) and silicon in the phosphoric acid are much greater, thus forming deep trenches 64 in the substrate 50. Preferably, the trenches thus formed are approximately 200 to 500 nm deep as measured from the original surface of the substrate 50. Typically, the oxidized side and bottoms surfaces of the trenches 64 are doped with suitable ions (e.g., boron or phosphor ions) to prevent channeling across the trenches.

Figure 3E:
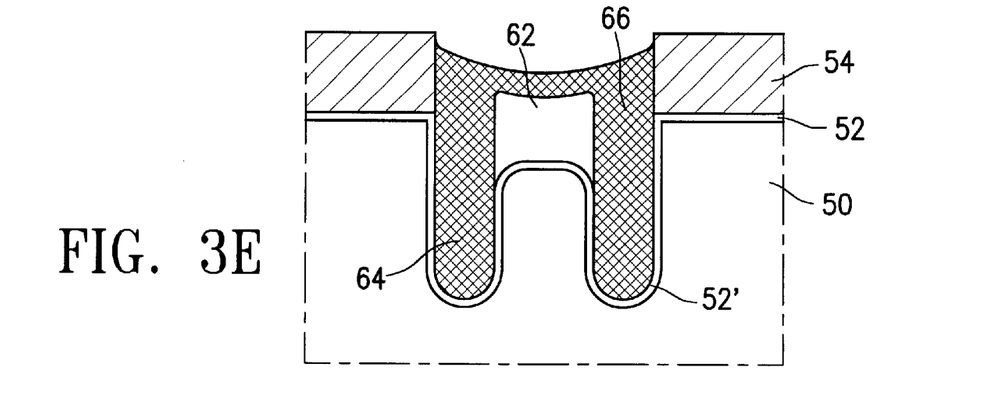
FIG. 3E is a schematic, cross-sectional representation of the substrate of FIG. 3D after deposition of polysilicon in the trenches.
Figure 3F:
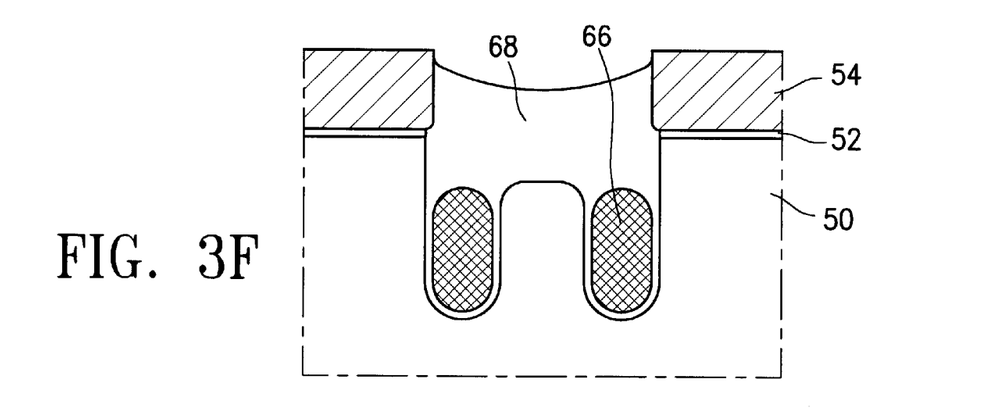
FIG. 3F is a schematic, cross-sectional representation of the substrate of FIG. 3E after oxidation of the top portion of the polysilicon.
Figure 3G:
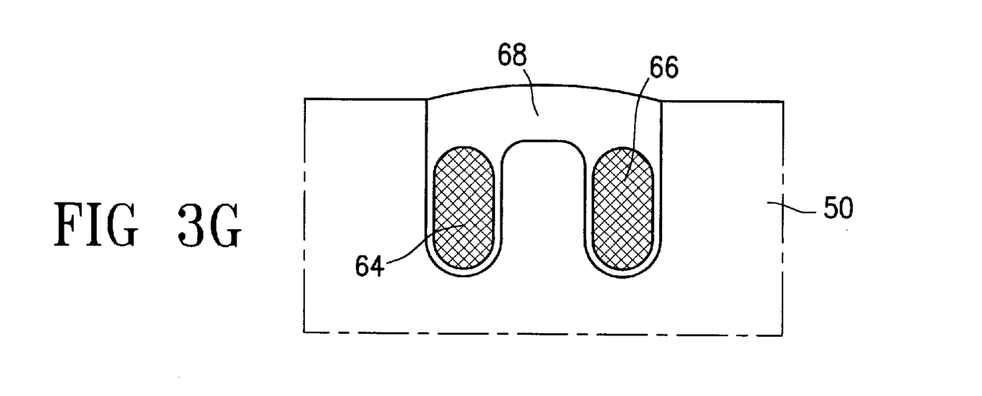
FIG. 3G is a schematic, cross-sectional representation of the substrate of FIG. 3F after formation of the trench isolation regions.

Referring to FIG. 3E, poly-Si 66 is deposited to till the trenches 64 and cover the first oxide 62. Preferably, poly-Si 66 is formed by a CVD process. The top portion of this poly-Si 66 is then oxidized by a thermal process. The pad nitride 54 remains largely intact because its thermal oxidation rate is much lower. The resulting new oxide, the first oxide 62 and the oxide 52' form a continuous mass of oxide 68; see FIG. 3F.

Finally, a chemical-mechanical polishing (CMP) process is conducted to remove the pad nitride 54, the pad oxide 52 and the top portion of the oxide 68, leaving the substrate 50 with trenches 64, which will function as the trench isolation regions separating IC elements to be fabricated on the substrate 50. See FIG. 3G. Typically, the top surface of the oxide 68 is slightly convex because the CMP process removes the pad nitride 54 at a slightly higher rate than the oxide 68.

While the invention has been particularly shown and described with reference to the above preferred embodiment, it will be understood by those skilled in the art that many other modifications and variations may be made thereto without departing from the broader spirit and scope of the invention as set forth in the claims. The specification and drawings are accordingly to be regarded as an illustrative, rather than restrictive.

What is claimed is:

1. A process of fabricating a plurality of oxide trench isolation regions on a substrate, comprising the steps of:

depositing one or more pad layers on said substrate;

removing portions of said pad layers and the surface regions of said substrate underneath said removed portions of said pad layers to pattern said pad layers and to form a plurality of active regions separated from a plurality of regions covered by said patterned pad layers;

forming one or more side walls at each said active region to cover portions of said active region other than the central portion of said active region;

depositing a first oxide at the space surrounded by said side walls and said central portion of said active region;

removing said side walls and forming one or more trenches at said active region; and forming a second oxide to fill said trenches and cover said first oxide, said second oxide and said first oxide together forming one of said oxide trench isolation regions.

2. The process of claim 1, wherein said pad layers comprising a pad oxide layer and a pad nitride layer.

3. The process of claim 2, further comprising the step of removing said one or more patterned pad layers.

4. The process of claim 3, wherein said removed surface regions of said substrate have a depth of approximately 20 to 100 nm.

5. The process of claim 3, further comprising between said step for patterning said pad layers and said step for forming said side walls the step of depositing a polysilicon layer on said active regions and said regions covered by said patterned pad layers.

6. The process of claim 5, wherein said polysilicon layer is deposited by a chemical vapor deposition (CVD) process and is approximately 10 to 50 nm thick.

7. The process of claim 3, wherein said side walls are composed of a material selected from plasma-enhanced chemical vapor deposition (PECVD) silicon nitride and PECVD silicon oxynitride.

8. The process of claim 3, wherein said trenches are approximately 200 to 500 nm deep as measured from the original surface of said substrate.

9. The process of claim 8, wherein the side and bottom surfaces of said trenches are doped with ions.

10. The process of claim 3, wherein said first oxide is CVD oxide.

11. The process of claim 2, wherein said step for forming said second oxide comprises an oxide-deposition step, a back-etch step and a chemical-mechanical-polishing (CMP) step;

said oxide-deposition step forming an oxide mass on said active regions and said regions covered by said patterned pad layers, said oxide mass comprising integrally a top portion, a middle portion and a bottom portion;

said back-etch step removing said top portion of said oxide mass; and said CMP step removing said patterned pad layers and said middle portion of said oxide mass, said bottom portion of said oxide mass forming said second oxide.

12. The process of claim 11, wherein said oxide is composed of a material selected from CVD oxide and high-density plasma chemical vapor deposition (HDPCVD) oxide.

13. A process of fabricating a plurality of trench isolation regions on a substrate of a VLSI device, comprising the steps of:

depositing one or more pad layers on said substrate;

r emoving portions of said pad layers and the surface regions of said substrate underneath said removed portions of said pad layers to pattern said pad layers and to form a plurality of active regions separated from a plurality of regions covered by said patterned pad layers;

forming one or more side walls at each said active region to cover portions of said active region other than the central portion of said active region;

depositing a first oxide at the space surrounded by said side walls and said central portion of said active region;

removing said side walls and forming one or more trenches at said active region;

depositing a polysilicon to fill said trenches and cover said first oxide, said polysilicon comprising integrally a top portion and a bottom portion; and oxidizing said top portion of said polysilicon to form a second oxide, said second oxide and said first oxide together forming an oxide mass, said oxide mass and said bottom portions of said polysilicon together forming one of said trench isolation regions.

14. The process of claim 13, wherein said step of oxidizing said top portion of said polysilicon is a thermal oxidation process.

15. The process of claim 14 wherein said pad layers comprising a pad oxide layer and a pad nitride layer.

16. The process of claim 15, further comprising the step of removing said one or more patterned pad layers and the top portion of said oxide mass.

17. The process of claim 16, wherein said step of removing said pad layers and the top portion of said oxide mass is a CMP step.

18. The process of claim 15, further comprising between said step for patterning said pad layers and said step for forming said side walls the step of depositing a polysilicon layer on said active regions and said regions covered by said patterned pad layers.

19. The process of claim 13, wherein said removed surface regions of said substrate have a depth of approximately 20 to 100 nm.

* * * * *